United States Patent
Klefenz et al.

(10) Patent No.: US 9,704,093 B2
(45) Date of Patent: Jul. 11, 2017

(54) ASYMMETRICAL MEMRISTOR

(71) Applicants: Fraunhofer-Gesellschaft zur Foerderung der angewandten Forschung e.V., Munich (DE); Technische Universitaet Ilmenau, Ilmenau (DE)

(72) Inventors: Frank Klefenz, Mannheim (DE); Peter Husar, Ilmenau (DE); Adam Williamson, Ilmenau (DE); Lars Schumann, Ilmenau (DE); Lars Hiller, Rudolstadt (DE); Ingo Hoerselmann, Ilmenau (DE); Andreas Schober, Erfurt (DE)

(73) Assignees: Fraunhofer-Gesellschaft zur Foerderung der angewandten Forschung e.V., Munich (DE); Technische Universitaet Ilmenau, Ilmenau (DE)

(*) Notice: Subject to any disclaimer, the term of this patent is extended or adjusted under 35 U.S.C. 154(b) by 0 days.

(21) Appl. No.: 14/799,488

(22) Filed: Jul. 14, 2015

(65) Prior Publication Data
US 2016/0019453 A1    Jan. 21, 2016

Related U.S. Application Data

(63) Continuation of application No. PCT/EP2013/050598, filed on Jan. 14, 2013.

(51) Int. Cl.
G06N 3/063    (2006.01)
G06N 3/04    (2006.01)
(Continued)

(52) U.S. Cl.
CPC .......... *G06N 3/04* (2013.01); *G06N 3/063* (2013.01); *G06N 3/0635* (2013.01); *G11C 11/54* (2013.01);
(Continued)

(58) Field of Classification Search
None
See application file for complete search history.

(56) References Cited

U.S. PATENT DOCUMENTS 5,206,541 A * 4/1993 Boahen ............... G06N 3/0635
706/18
2004/0150010 A1    8/2004 Snider et al.
(Continued)

FOREIGN PATENT DOCUMENTS

EP    1480225 A2    11/2004
JP    2012513686 A    6/2012
(Continued)

OTHER PUBLICATIONS

Ordosgoitti, J.R. (2010). "Development of a Non-Volatile Memristor Device Based on a Manganese-Doped Titanium Oxide Material." Diss. The University of Toledo. 116 pages.*
(Continued)

*Primary Examiner* — Stanley K Hill
*Assistant Examiner* — Benjamin Buss
(74) *Attorney, Agent, or Firm* — Perkins Coie LLP; Michael A. Glenn

(57) ABSTRACT

Embodiments of the present invention provide a memristor having a first electrode, a second electrode and a memristive layer arranged between the first electrode and the second electrode. Thereby, the memristor is adapted to obtain an asymmetrical current density distribution in the memristive layer.

6 Claims, 13 Drawing Sheets

(51) Int. Cl.
　　　G11C 11/54　　　(2006.01)
　　　G11C 13/00　　　(2006.01)
　　　H01L 45/00　　　(2006.01)
　　　H01L 27/24　　　(2006.01)
(52) U.S. Cl.
　　　CPC ...... *G11C 13/0007* (2013.01); *H01L 27/2436* (2013.01); *H01L 45/08* (2013.01); *H01L 45/1253* (2013.01); *H01L 45/146* (2013.01); *H01L 45/165* (2013.01); *G11C 2213/52* (2013.01)

(56)　　　　　　　References Cited

U.S. PATENT DOCUMENTS

| | | | | |
|---|---|---|---|---|
| 2009/0206375 | A1* | 8/2009 | Saha | H01L 27/098 257/281 |
| 2009/0317958 | A1* | 12/2009 | Tang | H01L 45/145 438/384 |
| 2010/0110746 | A1 | 5/2010 | Hutchinson et al. | |
| 2011/0004579 | A1* | 1/2011 | Snider | G06N 3/063 706/25 |
| 2011/0106742 | A1 | 5/2011 | Pino et al. | |
| 2011/0169052 | A1* | 7/2011 | Bratkovski | H01L 27/101 257/192 |
| 2011/0181347 | A1* | 7/2011 | Pickett | G11C 13/0059 327/538 |
| 2011/0266510 | A1* | 11/2011 | Quitoriano | H01L 45/146 257/2 |
| 2012/0011090 | A1* | 1/2012 | Tang | G06N 3/0635 706/33 |
| 2012/0014161 | A1 | 1/2012 | Pickett et al. | |
| 2012/0016829 | A1 | 1/2012 | Snider | |
| 2012/0132880 | A1* | 5/2012 | Bratkovski | H01L 45/08 257/3 |
| 2014/0122402 | A1* | 5/2014 | Bichler | G06N 3/0635 706/27 |
| 2014/0149824 | A1* | 5/2014 | Ordentlich | G11C 7/1006 714/763 |
| 2014/0153318 | A1* | 6/2014 | Perner | G11C 11/1673 365/148 |
| 2015/0311461 | A1* | 10/2015 | Cola | H01L 51/0048 136/259 |

FOREIGN PATENT DOCUMENTS

| | | |
|---|---|---|
| WO | 2010074689 A1 | 7/2010 |
| WO | 2010085225 A1 | 7/2010 |

OTHER PUBLICATIONS

Prodromakis, T. et al. (2010). "Fabrication and electrical characteristics of memristors with TiO2/TiO2+ x active layers." Proceedings of 2010 IEEE International Symposium on Circuits and Systems (ISCAS). pp. 1520-1522. DOI: 10.1109/ISCAS.2010.5537379.*
Sohn, J.I. et al. (2010). "Novel nonvolatile memory with multibit storage based on a ZnO nanowire transistor." Nano letters 10.11: 4316-4320. DOI: 10.1021/nl1013713.*
Adhikari, Shyam P. et al., "Memristor Bridge Synapse-Based Neural Network and Its Learning", IEEE Transactions on Neural Networks and Learning Systems, vol. 23, No. 9, Sep. 2012, pp. 1426-1435.
Beckett, Jamie , "Demystifying the memristor", Memristor found: HP Labs proves fourth integrated circuit element, Hewlett-Packard Development Company, L.P.,, http://www.hpl.hp.com/news/2008/apr-jun/memristor.html, Apr. 2008.
Chua, Leon , "Memristor—The Missing Circuit Element", IEEE Transactions on Circuit Theory, vol. CT-18, Sep. 1971, Sep. 5, 1971, pp. 507-519.

Graf, Norma et al., "Soft Matter: Electrochemically driven delivery to cells from vesicles embedded in polyelectrolyte multilayers", The Royal Society of Chemistry 2012, Soft Matter, 2012, 8, 3641, Laboratory of Biosensors and Bioelectronics, Institute for Biomedical Engineering, ETH Zurich, www.rsc.org/softmatter, Feb. 20, 2012, pp. 3641-3648.
Kim, Kuk-Hwan et al., "A Functional Hybrid Memristor Crossbar-Array/CMOS System for Data Storage and Neuromorphic Applications", Nano Letters, Electrical Engineering and Computer Science, The University of Michigan, Ann Arbor, Michigan 48109. pubs.acs.org/NanoLett, ACS Publications, 2011 American Chemical Society, 2011, pp. 389-395.
Laiho, Mika et al., "Cellular Nanoscale Network Cell with Memristors for Local Implication Logic and Synapses", Microelectronics Laboratory, University of Turka, Turku Finland, IEEE, 2010, pp. 2051-2054.
Min, Rogier et al., "Astrocyte signaling controls spike timing-dependent depression at neocortical synapses", Nature Neuroscience, Nature America, Inc. Department of Pysiology, University of Berne, Berne, Switzerland, Aug. 26, 2011.
Nere, Andrew et al., "A Neuromorphic Architecture for Object Recognition and Motion Anticipation Using Burst-STDP", Department of Electrical and Computer Engineering, University of Wisconsin-Madison, Madison, Wisconsin, United States of America. Department of Psychiatry, University of Wisconsin-Madison, Madison, Wisconsin, United States of America., www.plosone.org, May 2012, vol. 7, Issue 5, May 2012, pp. 1-17.
Pickett, Matthew D. et al., "Sub-100 fJ and sub-nanosecond thermally driven threshold switching in niobium oxide crosspoint nanodevices", Hewlett-Packard Laboratories, 1501 Page Mill Road, Palo Alto, CA 94304, stacks.iop.org/Nano/23/215202, Apr. 11, 2012, pp. 1-9.
Simon, Daniel T. et al., "Organic electronics for precise delivery of neurotransmitters to modulate mammalian sensory function", Nature materials, vol. 8, Letters, www.nature.com.naturematerials, Macmillan Publishers Limited, Jul. 5, 2009.
Strachan, John P. et al., "The switching location of a bipolar memristor: chemical, thermal and structural mapping", Nanoelectronic Research Group, Hewlett-Packard Labs, 1501 Page Mill Road, Palo Alto, CA 94304, USA, Department of Electrical and Computer Engineering, University of California, Santa Barbara, May 16, 2011.
Strukov, Dmitri et al., "The missing memristor found", Letters vol. 453, May 1, 2008, doi:10.1038/nature06932, Macmillan Publishers Limited., May 1, 2008, pp. 80-83, 1154.
Torrezan, Antonio C. et al., "Sub-nanosecond switching of a tantalum oxide memristor", IOP Science, Nanoelectronics Research Group, Hewlett-Packard Labs Online: stacks.iop.org/Nano/22/485203, Nov. 9, 2011, pp. 1-7.
Wang, Q. et al., ""Positive" and "negative" electric-pulse-induced reversible resistance switching effect in Pr0.7Ca0.3MnO3 films", State Key Laboratory of High Performance Ceramics and Superfine Microstructures, Shanghai Institute of Ceramics, Chinese Academy of Sciences, Shanghai 200050, P.R. China, Graduate School of the Chinese Academy of Sciences, Beijing 100039, P.R. China, Springer-Verlag 2006, Dec. 6, 2006, pp. 357-360.
Williams, Mike , "Silicon oxide circuits break barrier", Nanocrystal conductors could lead to massive, robust 3-D storage, http://news.rice.edu/2010/08/31/silicon-oxide-circuits-break-barrier/, http://pubs.acs.org/doi/abs/10.1021/nl102255r, Aug. 31, 2010.
Xia, et al., "Impact of geometry on the performance of memristive nanodevices", 2011.
Cantley, Kurtis D. et al., "Hebbian Learning in Spiking Neural Networks with Nonocrystalline Silicone TFTs and Memristive Synapses", IEEE Transactions on Nanotechnology, vol. 10, No. 5, Sep. 2011, pp. 1066-1073.

* cited by examiner

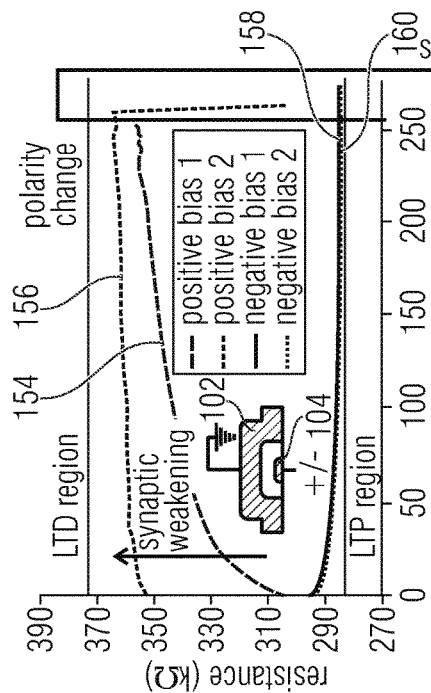
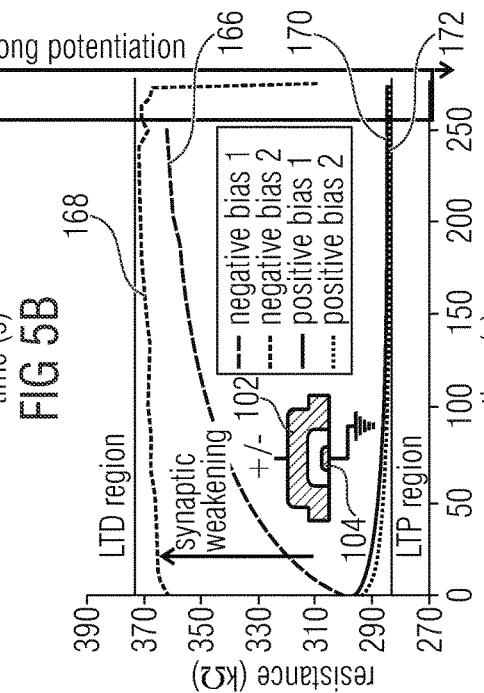
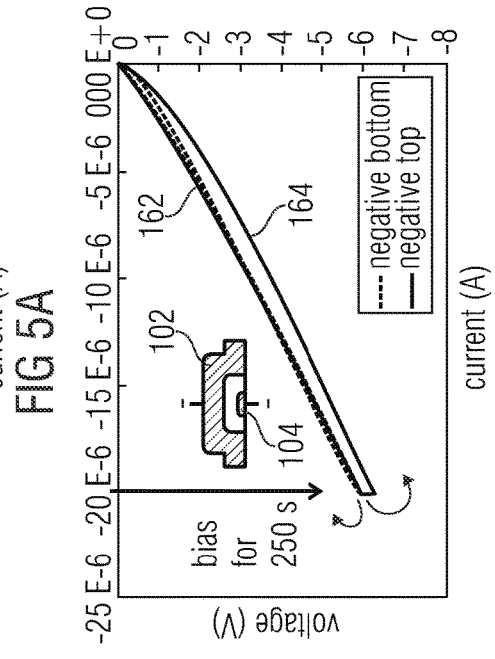

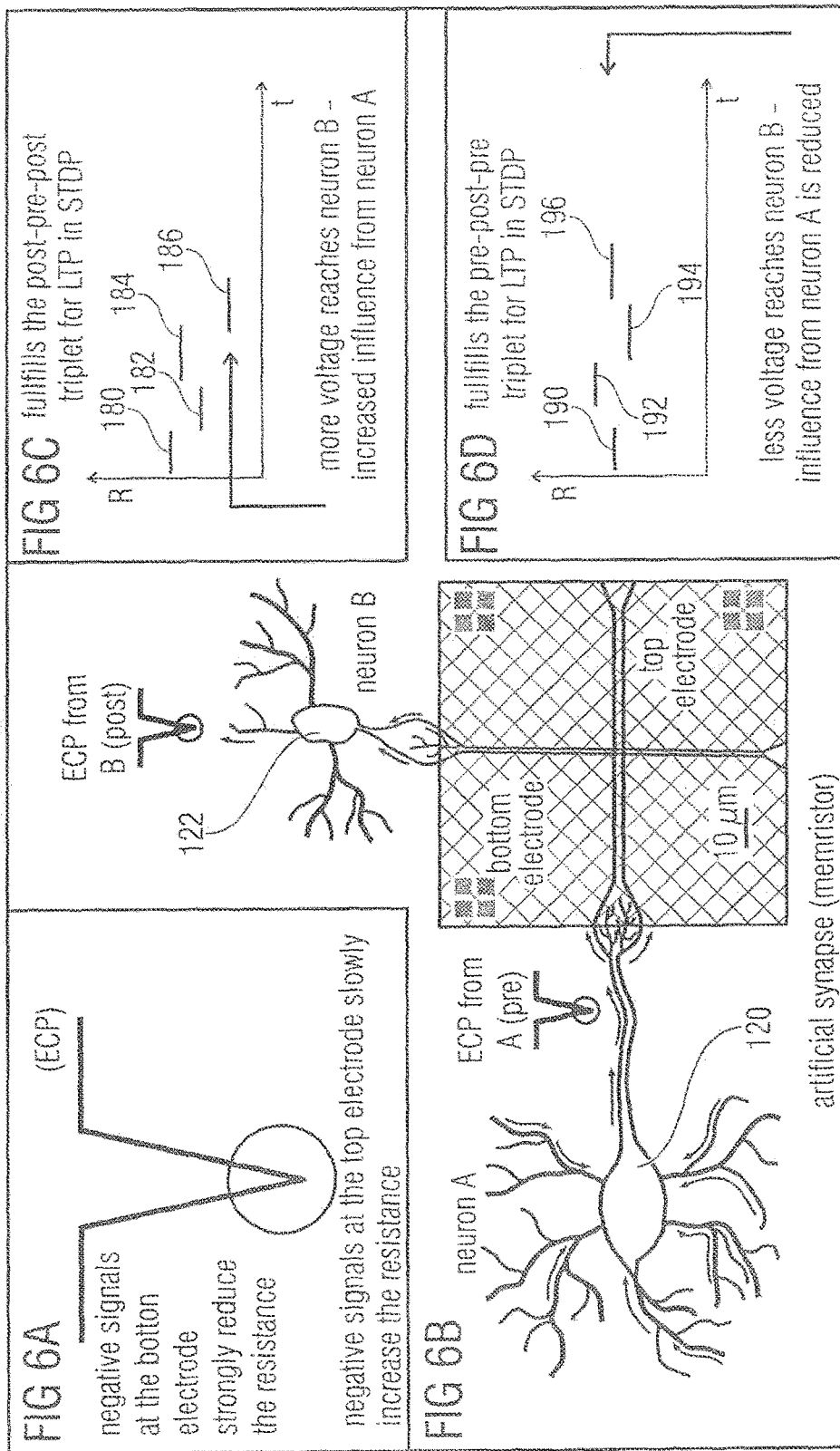

ASYMMETRICAL MEMRISTOR

CROSS-REFERENCE TO RELATED APPLICATION

This application is a continuation of copending International Application No. PCT/EP2013/050598, filed Jan. 14, 2013, which is incorporated herein by reference in its entirety.

BACKGROUND OF THE INVENTION

Embodiments of the present invention relate to an asymmetrical memristor. Further embodiments relate to a neural network comprising an asymmetrical memristor. Some embodiments relate to a biohybrid synapse.

A central key element of information processing in the brain are the neurons comprising cell body's (soma), axons, dendrites and synapses. The electric stimulus transmission between neurons takes place via synapses. Neurotransmitter vesicles are emitted into the synaptic gap, defuse through the post-synaptic gap and specifically dock onto ion channel type anchor points. By docking, the configuration of the ion channel changes and it becomes permeable for ions as long as the neurotransmitters dock. Neuromorphic computing is based thereon and tries to abstractly describe the neuron as a mathematical model and realize the same as an electric circuit element in order to thus massively emulate switching processes of the brain in parallel [Mika Laiho and Eero Lehtonen, Cellular nanoscal network cell with memristors for local implication logic synapses, ISCAS, page 2051-2054. IEEE (2010)]. In the 90's, with the patch clamp method it was for the first time possible to prove how synaptic connections between neurons are strengthened or weakened by the time-relative firing performance. The learning rule is termed "spike timing dependent plasticity (STDP)". The mechanism in biological systems is described in detail by a three-part synapses constellation between neurons and astrocyte [Roger Min, Thomas Nevian, Astrocyte signaling controls spike timing-dependent depression at neocortical synapses, Nature Neuroscience, Vol. 15, No. 5 May 2012].

The idea of the memristor was introduced more than 40 years ago by Leon Chua [Chua, L. O., Memristor—the missing circuit element, IEEE Trans. Circuit Theory (1971), 507-519.]. The memristor is a two-terminal passive device with a variable internal resistance. This resistance depends on the amount of charge which passed through the memristor by a bias applied before. As soon as the desired internal resistance is adjusted, this biasing is interrupted. The memristor will thus maintain exactly this internal resistance until the next biasing is applied. Recently, the memristor was discussed in literature in connection with synapses and neuro-morphological systems [Kuk-Hwan Kim, Siddharth Gaba, Dana Wheeler, Jose M. Cruz-Albrecht, Tahir Hussain, Narayan Srinivasa and Wei Lu, A Functional Hybrid Memristor, Crossbar-Array/CMOS System for Data Storage and Neuromorphic Applications, dx.doi.org/10.1021/n/203687n, Nano Lett. 2012, 12, 389-395.], [Duygu Kuzum, Rakesh G. D. Jeyasingh, Byoungil Lee, and H.-S. Philip Wong, Nano-electronic Programmable Synapses Based on Phase Change Materials for Brain-Inspired Computing, Nano Letters, dx.doi.org/10.1021/n/201040y, 2011,], [John Paul Strachan, Dmitri B. Strukov, Julien Borghetti, J. Joshua Yong, Gilberto Medeiros-Ribeiro and R. Stanley Williams, The switching location of a bipolar memristor: chemical, thermal and structural mapping, Nanotechnology 22 (2011) 254015 (6pp) doi:10.1088/0957-4484/22/25/254015].

First physical realizations of conventional memristor structures based on thin film technologies were published in 2007 [Q. Wang, D. S. Shang, Z. H. Wu, L. D. Chen, X. M. LI: "Positive" and "negative" electric-pulse-induced reversible resistance switching effect in Pr0.7Ca0.3Mn03 films. In: Appl. Phys. A. 86, 2007, pp. 357-360]. In April 2008, researchers of the company Hewlett-Packard [HP Labs: Memristor found: HP Labs proves fourth integrated circuit element] presented a layered composite of titanium dioxide with platinum electrodes as a memristor having a relatively simple setup. At the end of August 2010, documents by Jun Yao of Rice University disclosed that also simple silicon dioxide works as a layer material [Heise-Newsticker: Memristor aus Siliziumoxid-Nanodrähten] [Mike Williams: Silicon oxide circuits break barrier (engl.)].

In the US 2004/0150010 A1 an array of nanowires is described, where at each crossing an input and an output wire cross. Using this system, "threshold functions", i.e. preferably sigmoidal threshold value functions, may be simulated which however always provide the same symmetric response function [Shyam Prasad Adhlkari, Changju Yang, Hyongsuk Kim, Member, IEEE, and Leon O. Chua, Fellow, Memristor Bridge Synapse-Based Neural Network and its Learning, IEEE TRANSACTIONS ON NEURAL NETWORKS AND LEARNING SYSTEMS, VOL. 23, NO. 9, September 2012].

With an exact analysis of the biological data, it now turns out that a real biological neuronal network with its neurons and their synapses comprises a clearly more complex behavior than mentioned in the above-mentioned documents. Thus, in biological reality, the dynamic learning behavior of a synapse is only partially characterized by sigmoidal response behavior, as together with complex biochemistry an asymmetry in signal transmission (from axon to dendrite) exists which is not physically copied by the above devices, structures or circuitries. This technical deficiency of the introduced classic memristors finally leads to the fact that the so-called "spike-timing-dependent-plasticity (STDP)", which is substantial for the learning behavior of neurons, may not be copied using those systems [Andrew Nere, Umberto Olcese, David Balduzzi, Giulio Tononi, A Neuromorphic Architecture for Object Recognition and Motion Anticipation Using Burst-STDP, PLoS ONE, Vol. 7, Issue 5, 1 May 2012, e36958].

All classical memristor architectures are thus based on symmetrical concepts as they are conventionally used by a person skilled in the art in the design of micro-electronic circuitries, as they are easily implemented and comprise a clear, symmetrical response behavior due to symmetry [Henry Markram, Wulfram Gerstner and Per Jesper Sjöström, A history of spike-timing-dependent plasticity, Frontiers in Synaptic Neuroscience, Vol. 3, Article 4, August 2011].

Even the simulation of neuronal networks with the help of analog, micro-electronical systems may do without a physical implementation of the asymmetries in physical realization [Spektrum der Wissenschaft, Karl-Heinz-Meier, September 2012].

Thus, such hardware implementations represent no possibility to directly interconnect with real biological neuron networks as they do not copy the function of real biological synapses (e.g., symmetry of the information flow, learning behavior). This means that, for example, a real biological neuron cannot feel the signal behavior on the opposite side of the hardware as the signals are in a non-compatible measurement range.

Therefore, it is the object of the present invention to provide a concept that enables to model or reproduce the functionality of a real biological synapse.

SUMMARY

According to an embodiment, an artificial tripartite synapse may have: a memristor, having a first electrode, a second electrode and a memristive layer arranged between the first electrode and the second electrode, wherein the memristor is adapted to obtain an asymmetrical current density distribution in the memristive layer; and a field effect transistor; wherein the memristor is connected to a gate of the field effect transistor; wherein the memristive layer has an asymmetrical doping density distribution or an asymmetrical trap density distribution in order to obtain the asymmetrical current density distribution in the memristive layer; and wherein the current density varies along an equipotential line within the memristive layer or wherein the current density within the memristive layer is asymmetrical along a current path from the first electrode to the second electrode.

Another embodiment may have a neural network having an artificial tripartite synapse as mentioned above.

Embodiments of the present invention provide a memristor comprising a first electrode, a second electrode and a memristive layer arranged between the first electrode and the second electrode. The memristor is adapted to obtain an asymmetrical current density distribution in the memristive layer.

According to the concept of the present invention, the functionality of a real biological synapse can be copied or reproduced by an asymmetrical memristor which is adapted to obtain an asymmetrical current density distribution within the memristive layer.

Further embodiments provide a neural network comprising a memristor. The memristor comprises a first electrode, a second electrode and a memristive layer arranged between the first electrode and the second electrode. The memristor is adapted to obtain an asymmetrical current density distribution in the memristive layer.

Further embodiments provide an artificial tripartite synapse comprising a field effect transistor and a memristor connected to a gate of the field effect transistor. The memristor comprises a first electrode, a second electrode and a memristive layer arranged between the first electrode and the second electrode. The memristor is adapted to obtain an asymmetrical current density distribution in the memristive layer.

BRIEF DESCRIPTION OF THE DRAWINGS

Embodiments of the present invention are described herein making reference to the appended drawings.

FIG. 5a shows in a diagram the current-voltage characteristic of the memristor for a positive voltage sweep applied to the first electrode and the current-voltage characteristic of the memristor for a positive voltage sweep applied to the second electrode;

FIG. 5b shows in a diagram a temporal change of the resistance of the memristor when applying two subsequent positive biases and two subsequent negative biases to the second electrode;

FIG. 5c shows in a diagram the current-voltage characteristic of the memristor for a negative voltage sweep applied to the first electrode and the current-voltage characteristic of the memristor for a negative voltage sweep applied to the second electrode;

FIG. 5d shows in a diagram a temporal change of the resistance of the memristor when applying two subsequent positive biases and two subsequent negative biases to the first electrode;

FIG. 6a shows a schematical illustration of an extracellular potential;

FIG. 6b shows an illustrative view of a first neuron, a second neuron and a memristor connected between the first neuron and the second neuron, according to an embodiment of the present invention;

FIG. 6c shows in a diagram a temporal change of the resistance of the memristor when a post-synaptic, pre-synaptic and post-synaptic (post-pre-post triplet) extracellular potentials are applied subsequently to the memristor;

FIG. 6d shows in a diagram a temporal change of the resistance of the memristor when a pre-synaptic, post-synaptic and pre-synaptic (pre-post-pre triplet) extracellular potentials are applied subsequently to the memristor;

DETAILED DESCRIPTION OF THE INVENTION

Figure 1:
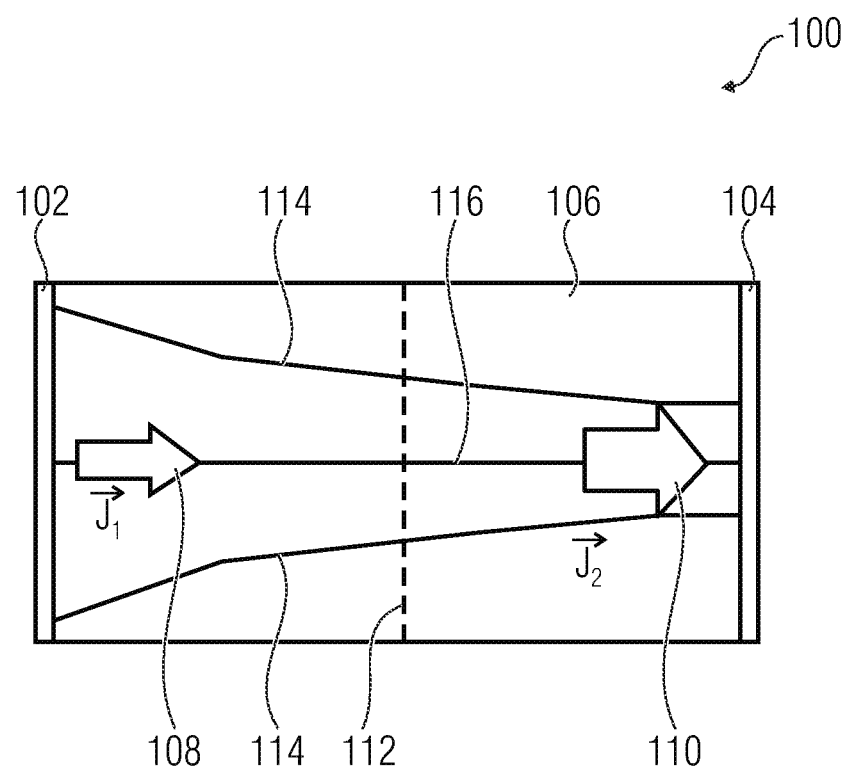
FIG. 1 shows a block diagram of a memristor according to an embodiment of the present invention.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of a memristor 100 according to an embodiment of the present invention. The memristor 100 comprises a first electrode 102, a second electrode 104 and a memristive layer 106 arranged between the first electrode 102 and the second electrode 104. The memristor 100 is adapted to obtain an asymmetrical current density $\vec{J}$ distribution in the memristive layer 106.

Note that in FIG. 1, a first arrow 108 indicates a first current density $\vec{J}_1$ (e.g., within a first area of the memristive layer 106, such as an area adjacent to the first electrode 102), wherein a second arrow 110 indicates a second current density $\vec{J}_2$ (e.g., within a second area of the memristive layer 106 different from the first area, such as an area adjacent to the second electrode 104), different from the first current density $\vec{J}_1$.

For example, the memristor 100 can be configured to obtain the asymmetrical current density distribution in the memristive layer 106 such that the first current density $\vec{J}_1$ is greater than the second current density $\vec{J}_2$. Naturally, also the second current density $\vec{J}_2$ can be greater than the first current density $\vec{J}_1$.

As indicated in FIG. 1, the current density $\vec{J}$ can vary along an equipotential line 112 (or equipotential area) within the memristive layer 106.

Note that, a trajectory of the equipotential line 112 may depend on the implementation of the memristor 100, alternatives of which are described below. For example, the equipotential line 112 may comprise a straight trajectory as shown in FIG. 1, or a curved trajectory.

Moreover, a conductive cross-section 114 of the memristive layer 106 may vary along a current path 116 from the first electrode 102 to the second electrode 104.

For example, the conductive cross-section 114 of the memristive layer 106 adjacent to (or bordering) the first electrode 102 can be greater than the conductive cross-section 114 of the memristive layer 106 adjacent to (or bordering) the second electrode 104.

Furthermore, the current density $\vec{J}$ within the memristive layer 106 can be asymmetrical along a current path 116 from the first electrode 102 to the second electrode 104.

For example, the current density along the current path 116 may increase from the first electrode 102 to the second electrode 104.

The memristor 100 can comprise an asymmetry with respect to an unchangeable structural feature, to obtain the asymmetrical current density $\vec{J}$ distribution in the memristive layer 106.

The unchangeable structural feature of the memristor 100 can be a geometrical feature, such as a shape or form of the first electrode 102, the second electrode 104 and/or the memristive layer 106.

Moreover, the unchangeable structural feature of the memristor 100 can be a material feature which is unaffected by a state of the memristor 100, such as a doping concentration or trap density or electromigration of vacancies or construction and deconstruction of filaments using an interplay of thermal effects and redox reactions in filaments of the memristive layer 106. The state of the memristor 100 can be characterized by the current flowing through the memristor 100 and/or by a voltage drop over the memristor 100. Thus, an increase or decrease of the current flowing through the memristor and/or of the voltage drop over the memristor may not change the material feature of the memristor 100.

In other words, embodiments provide a device/structure which enables to build up asymmetric memristors 100 with the help of preferably nanotechnological methods. On the basis of this asymmetry it is possible for the first time to realize with a technical device biohybrid synapses as they occur in nature in neuronal cells.

The asymmetric memristor 100 is able to model STDP via the asymmetry of information transmission.

In addition, the neuro-conformal asymmetric memristor 100 enables measuring or contacting neuronal cells influencing the cells minimally. Apart from that, the asymmetric memristor 100 enables coupling or developing hybrid systems of technical and real biological systems in a biocompatible way in contrast to all technical systems which have so far been introduced.

The inventive asymmetric memristor 100 presented herein surprisingly solves the problem of directional information transmission, thereby, the asymmetry can be realized on the one hand by means of a geometrical arrangement and on the other hand by means of a layer composition of used materials.

As already mentioned, the memristor 100 is adapted to obtain an asymmetrical current density $\vec{J}$ distribution in the memristive layer 106. In other words, the different inventive implementations of the device may fulfill the boundary condition of an asymmetrical current density $\vec{J}$.

Figure 4B:
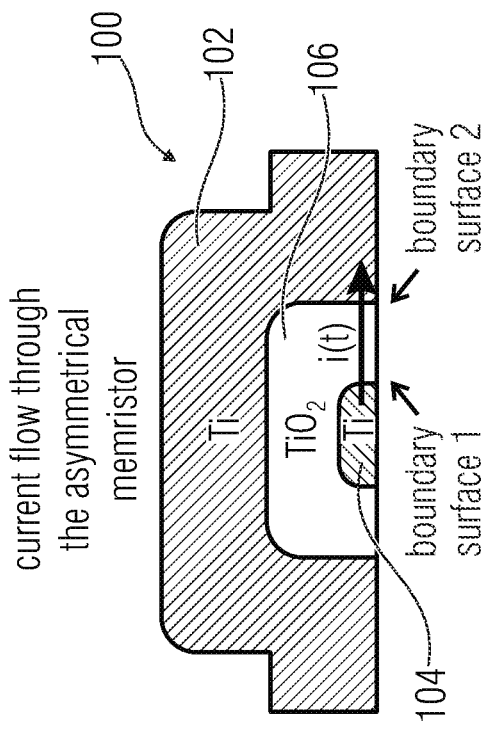
FIG. 4b shows a cross-sectional view of a memristor according to an embodiment of the present invention.

In some embodiments, the memristive layer 106 can comprise $TiO_2$ (e.g., as indicated in FIG. 4(b)). Naturally, the memristive layer 106 may also comprise (or consist of) any other suitable memristive material, such as $TaO_2$ or $NbO_2$. Moreover, the memristive layer 106 may be build up by means of a plurality of memristive sub-layers, wherein the memristive sub-layers may comprise the same or different memristive materials.

The first electrode 102 and/or the second electrode 104 can comprise Ti (e.g., as indicated in FIG. 4(b)). Of course, the first electrode 102 and/or the second electrode 104 may also comprise (or consist of) any other suitable material, such as Pt or Pd.

Figure 2A:
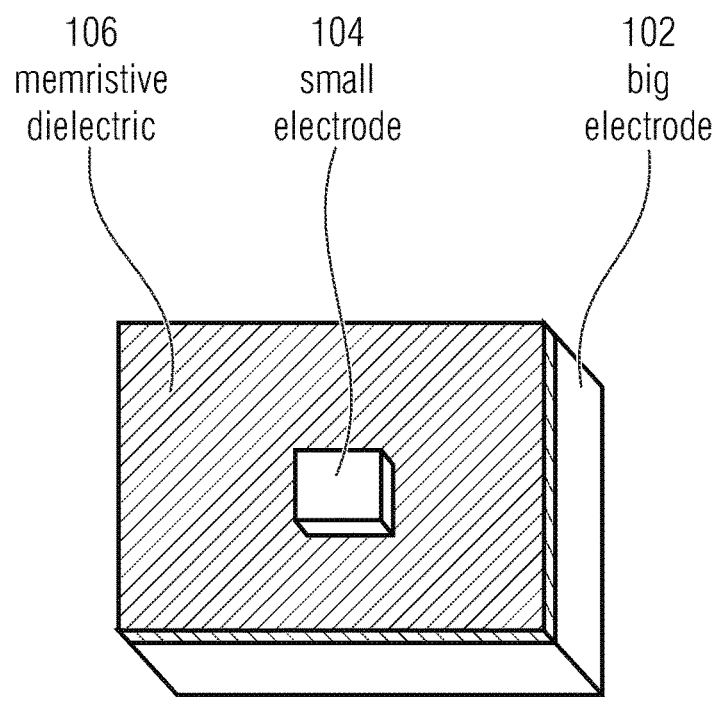
FIG. 2a shows a perspective view of a memristor with a geometrical asymmetry according to an embodiment of the present invention.

FIG. 2a shows a perspective view of a memristor 100 with a geometrical asymmetry according to an embodiment of the present invention. An area of the first electrode 102 can be at least by a factor of 1.5 (or 2, 3, 5, 10, 20, 50, or 100) greater than an area of the second electrode 104, in order to obtain the asymmetrical current density $\vec{J}$ distribution in the memristive layer 106.

Note that the area of the first electrode 102 can be the area of the first electrode 102 which contacts the memristive layer (e.g., a first surface area of the memristive layer 106), wherein the area of the second electrode 104 can be the area of the second electrode 104 which contacts the memristive layer 106 (e.g., a second surface area of the memristive layer 106).

As shown in FIG. 2a, the first electrode 102 (or big electrode), the second electrode 104 (or small electrode) and the memristive layer 106 can each comprise a rectangular shape. The memristive layer 106 can comprise a first surface area contacting the first electrode 102 and a second surface area contacting the second electrode 104. The first surface area and the second surface area can comprise the same size. Further, the area of first electrode 102 can comprise the same size as the first surface area, wherein the area of the second electrode 104 can be in two dimensions smaller in size than the second surface area. The two dimensions can be perpendicular to each other and parallel to the second surface area.

Figure 2B:
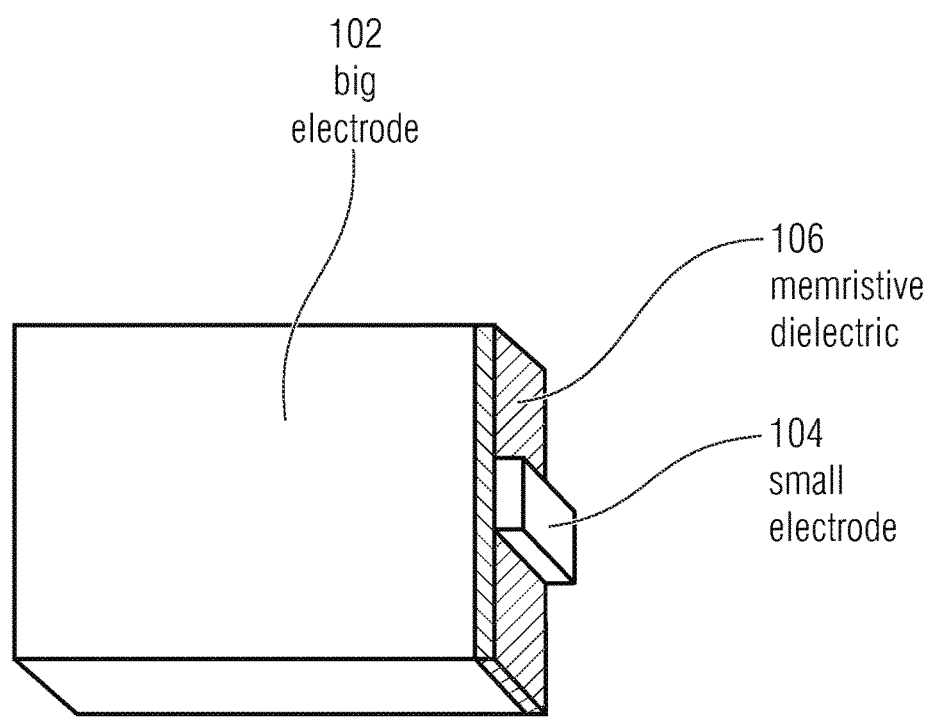
FIG. 2b shows a perspective view of a memristor with a geometrical asymmetry according to a further embodiment of the present invention.

FIG. 2b shows a perspective view of a memristor 100 with a geometrical asymmetry according to a further embodiment of the present invention. In contrast to FIG. 2a, the area of the second electrode 104 is only in one of the two dimensions smaller in size than the second surface area.

Figure 2C:
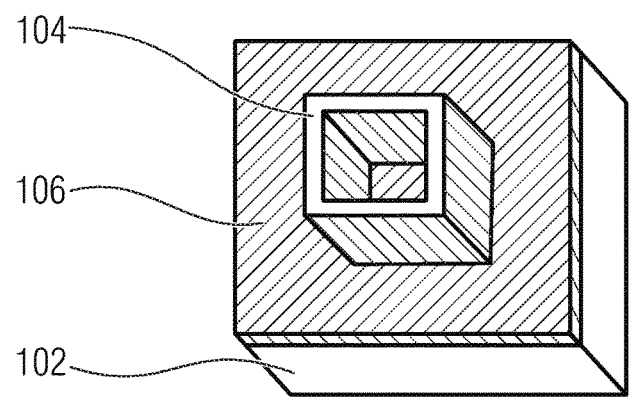
FIG. 2c shows a perspective view of a memristor with a geometrical asymmetry according to a further embodiment of the present invention.

FIG. 2c shows a perspective view of a memristor 100 with a geometrical asymmetry according to a further embodiment of the present invention. In contrast to FIG. 2a, the second electrode 104 can comprise the shape of a rectangular tube.

Figure 2D:
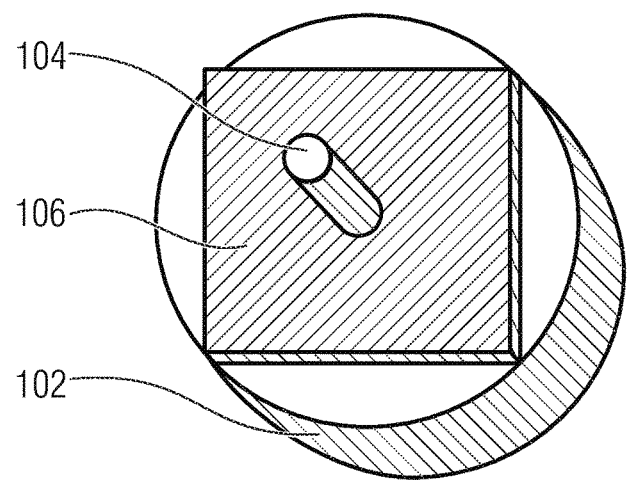
FIG. 2d shows a perspective view of a memristor with a geometrical asymmetry according to a further embodiment of the present invention.

FIG. 2d shows a perspective view of a memristor 100 with a geometrical asymmetry according to a further embodiment of the present invention. In contrast to FIG. 2a, the first electrode 102 and the second electrode 104 comprise a circular shape, wherein the memristive layer 106 comprises a quadratic shape. Thereby, a diameter of the area of the first electrode 102 may be equal to or greater than a diagonal of the rectangular first surface area of the memristive layer 106.

Figure 2E:
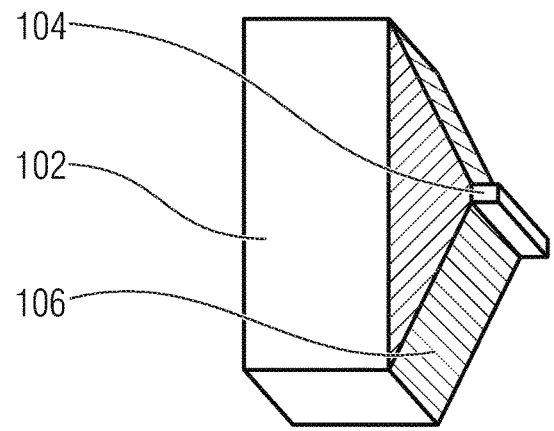
FIG. 2e shows a perspective view of a memristor with a geometrical asymmetry according to a further embodiment of the present invention.

FIG. 2e shows a perspective view of a memristor 100 with a geometrical asymmetry according to a further embodiment of the present invention. An area (e.g., first surface area) of the memristive layer 106 contacting the first electrode 102 can be at least by a factor of 1.5 greater than an area (e.g., second surface area) of the memristive layer 106 contacting the second electrode 104.

Figure 2F:
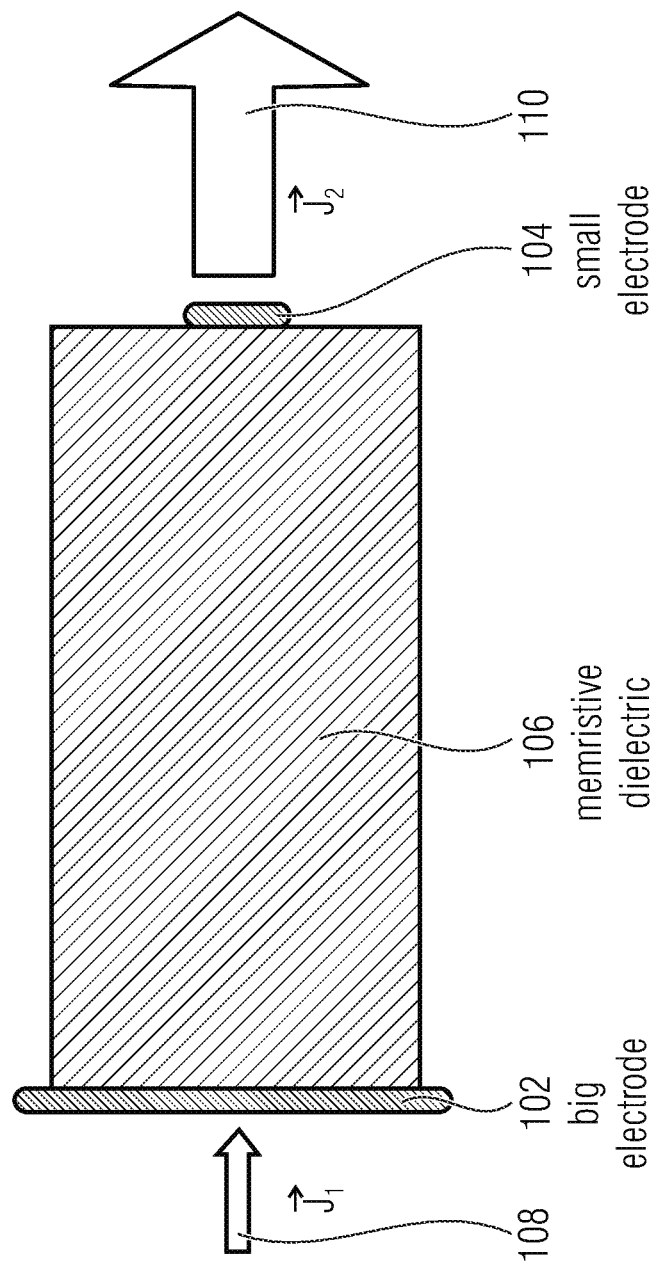
FIG. 2f shows a cross-sectional view of one of the memristors shown in FIGS. 2a to 2e.

FIG. 2f shows a cross-sectional view of one of the memristors 100 shown in FIGS. 2a to 2e. Thereby, a first arrow 108 indicates the current density along the first electrode 102, wherein a second arrow 110 indicates the current density along the second electrode 104.

In other words, in FIGS. 2a and 2b a geometrical arrangement for rectangular structures is illustrated with a geometrical asymmetry. In FIG. 2a, the structure comprises a large rectangular bottom electrode 102 and is contacted from the top with a small rectangular electrode 104 via the memristive dielectric 106. In FIG. 2b, the contacting of the large rectangular bottom electrode 102 is rotated and applied to the side, but for both structures an asymmetrical current density is given. With a geometrical rotation, the asymmetrical function remains and the current density remains asymmetric. Further asymmetrical geometries of preferred implementations are illustrated in FIGS. 2c to 2e of spherical, cylindrical or mixed structures. The same also results in the necessary asymmetrical current density.

The asymmetric function (e.g., asymmetric electrical function of the memristor 100) is a result of the asymmetrical current density and such an asymmetrical current density can be provided by an asymmetrical geometry.

In addition or alternatively, the memristive layer 106 can comprise an asymmetrical doping density distribution or an asymmetrical trap density distribution or asymmetrical distribution in electromigration of vacancies or asymmetrical distribution in the construction and deconstruction of filaments using an interplay of thermal effects and redox reactions in filaments of the memristive layer in order to obtain the asymmetrical current density distribution in the memristive layer 106.

In other words, an asymmetrical function may be acquired by an electrical asymmetry. However, also with symmetrical structures an asymmetry may be acquired, for example, via a one-sided doping or a change of the trap density or asymmetrical electromigration of vacancies or asymmetrical construction and deconstruction of filaments in the memristive layer with one of the symmetrical electrode surfaces. Of course, also combinations of geometrical and material systems are possible.

The implementation of asymmetrical memristors 100 requires memristive materials. Some known memristive materials in literature are the oxides of Ti [Dmitri B. Strukov, Gregory S. Snider, Duncan R. Stewaret, R. Stanley Williams, The missing memristor found, Nature, Vol. 453, (2008),] Ta [Antonio C Torrezan, John Paul Strachan, Gilberto Medeiros-Ribeiro, R. Stanley Williams, Sub-nanosecond switching of a tantalum oxide memristor, Nanotechnology 22 (2011)], and Nb [Matthew D. Pickett, R. Stanley Williams, Sub-100 fJ and sub-nanosecond thermally driven threshold switching in niobium oxide crosspoint nanodevices, Nanotechnology 23 (2012) 215202]. But all known or unknown materials which have a memristive effect and provide a hysteretic change of the resistance are memristive materials.

Here, of course also combinations of geometrical material asymmetries are possible.

In the following, the asymmetrical structure of the biological synapse between a pre-synaptic neuron and a post-synaptic neuron and its asymmetrical function is described.

Figure 3A:
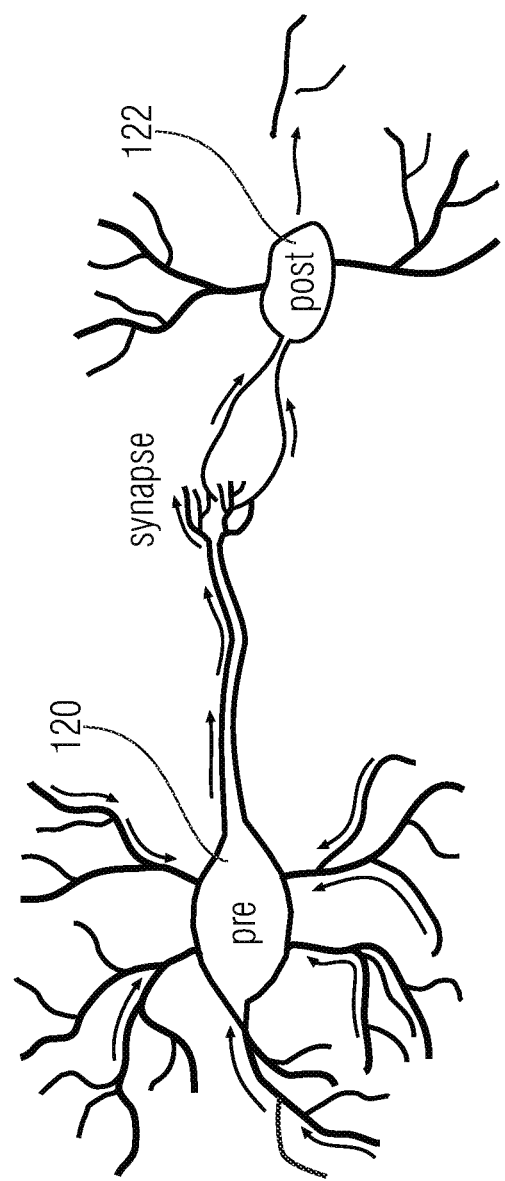
FIG. 3a shows an illustrative view of a first neuron, a second neuron and a synapse connecting the first neuron and the second neuron.
Figure 3B:
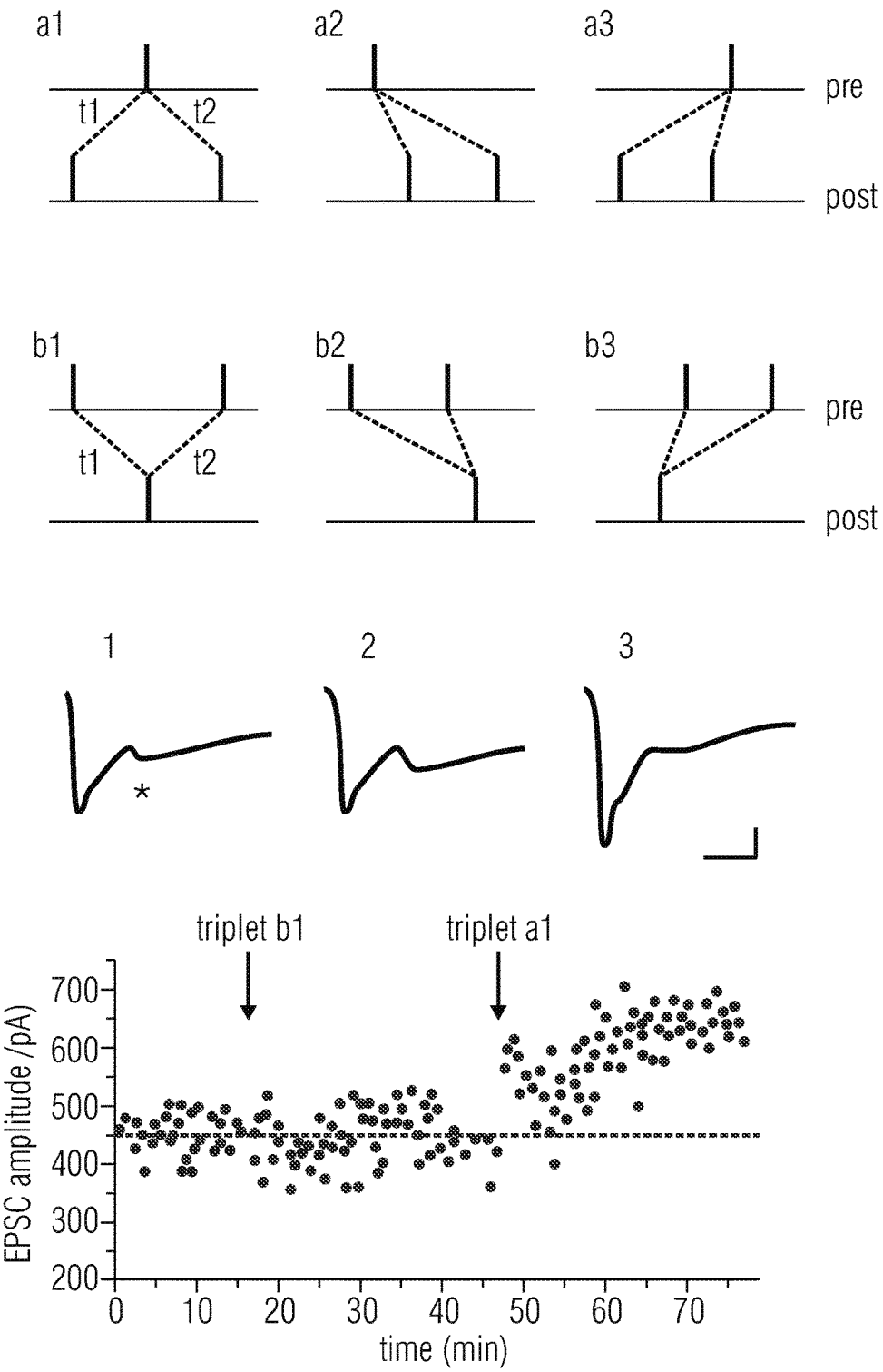
FIG. 3b shows an illustrative view of an asymmetrical function of the synapse.

The plurality of neurons generally consist of neuronal cell body's comprising axons and many dendrites. In FIG. 3a the asymmetrical structure of a synapse between a first so-called pre-synaptical neuron 120 and a subsequent second so-called post-synaptical neuron 122 is illustrated. Moreover, it is indicated in FIG. 3b that the function of this synapse also is asymmetrical [Bi, Wang, Temporal asymmetry in spike timing-dependent plasticity, Physiology & Behaviour, 77 (2002) 551-555].

Signals in a neuronal network conventionally arrive in the form of spikes from the pre-synaptic neuron 120 to the post-synaptic neuron 122. As an example, in FIG. 3b an amount of three spikes is illustrated which are designated differently depending on time (a so-called triplet) as a1, a2, a3 or as b1, b2, and b3. The difference between the triplets is that in the a-series a spike in the pre-synaptic neuron 120 each induced three times two spikes, one after the other, in the post-synaptic neuron 122, while in the b-series in the post-synaptic neuron 122 only one spike each was produced with two arising spikes.

For a symmetrical function, with the b-series a reversed effect would be expected on the synapse as compared to the a-series. As illustrated in FIG. 3b, however, the b-series provides no change with respect to the "evoked post-synaptic current" (EPSC) and the a-series provides an amplification of the EPSC.

Therefore, a biohybrid synapse has to implement this asymmetry in the function. The device which accurately implements this asymmetrical function is the device designated as asymmetric memristor 100.

Subsequently it is proofed that the asymmetrical memristor 100, in contrast to symmetrical systems, may simulate a real synapse behavior.

In memristors, the resistance depends on the amount of charge which flew through the memristor due to a biasing. As soon as the desired internal resistance is set, this biasing is interrupted. The memristor will thus maintain exactly this internal resistance until the next bias is applied. The idea of such a device was introduced more than 40 years ago [Chua, L. O., Memristor—the missing circuit element, IEEE Trans. Circuit Theory (1971), 18, 507-519], but was recently discussed in literature in connection with synapses and neuromorphological systems [Kuk-Hwan Kim, Siddharth Gabe, Dana Wheeler, Jose M. Cruz-Albrecht, Tahir Hussain, Narayan Srinivasa and Wei Lu, A Functional Hybrid Memristor Crossbar-Array/CMOS System for Data Storage and Neuromorphic Applications, dx.doi.org/10.1021/n1203687n, Nano Lett. 2012, 12, 389-395], [Duygu Kuzum, Rakesh G. D. Jeyasingh, Byoungil Lee, and H.-S. Philip Wong, Nanoelectronic Programmable Synapses Based on Phase Change Materials for Brain-Inspired Computing, Nano Letters dx.doi.org/10.1021/n1201040y, 2011], [John Paul Strachan, Dmitri B. Strukov, Julien Borghetti, J. Joshua Yang, Gilberto Medeiros-Ribeiro and R. Stanley Williams, The Switching location of a bipolar memristor: chemical, thermal and structural mapping, Nanotechnology 22 (2011) 254015 (6pp) doi:10.1088/0957-4484/22/25/254015].

In a symmetrical memristor, data transmission is symmetrical. It is illustrated in the following that the symmetric memristor may not model the above-mentioned characteristics of the STDP.

In contrast to that it is proven that, for example, in an inventive implementation of the asymmetric memristor 100 the above-mentioned characteristics of the STDP may be implemented correctly and thus as a consequence the asymmetric memristor 100 represents a biohybrid synapse [Rogier Min and Thomas Nevian, Astocyte signaling controls spike timing-dependent depression at neocortical synapses, Nature Neuroscience, Vol. 15, No. 5, May 2012].

Figure 4A:
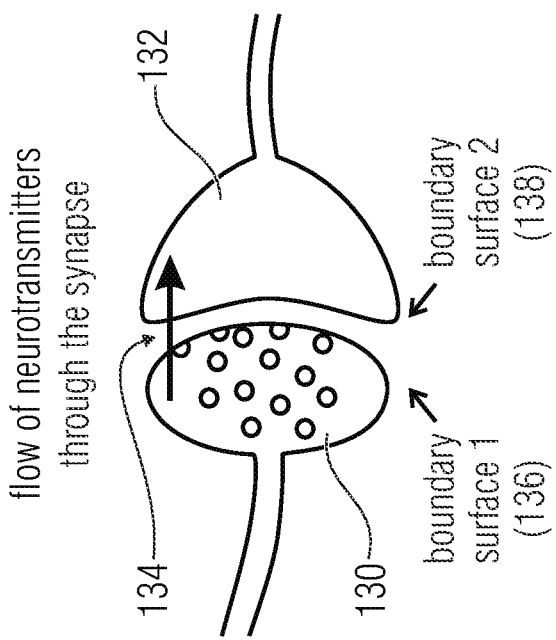
FIG. 4a shows an illustrative view of an axon, a dendrite and a synapse, including and a neurotransmitter flow from the axon through the synapse to the dendrite.
Figure 4C:
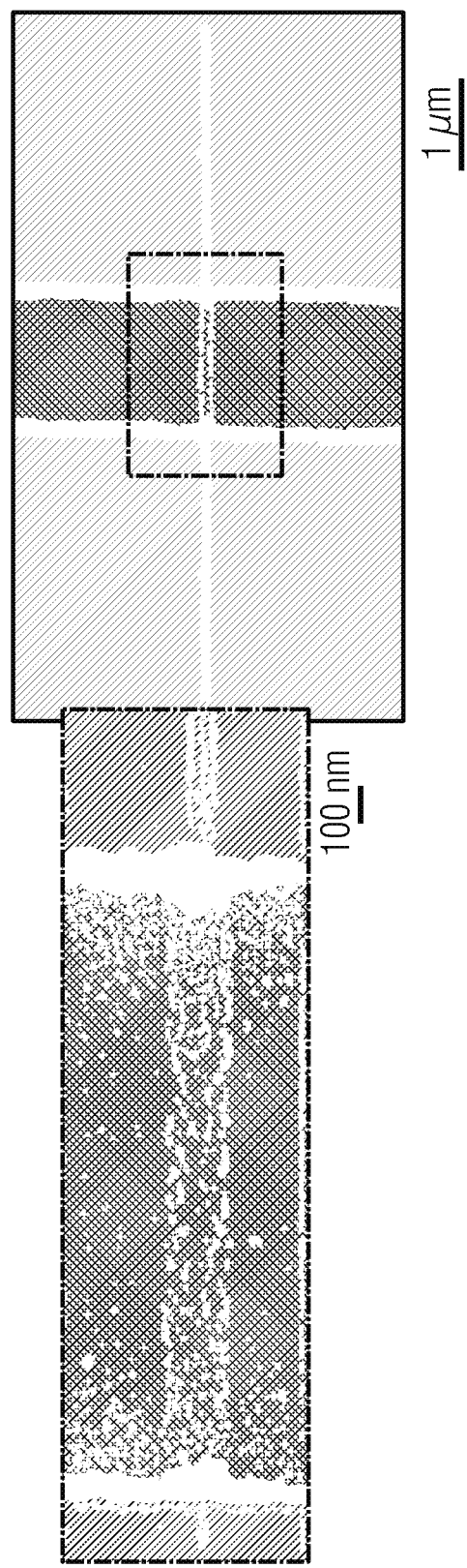
FIG. 4c shows an illustrative view of a scanning electron microscope image of the memristor shown in FIG. 4b.
Figure 4D:
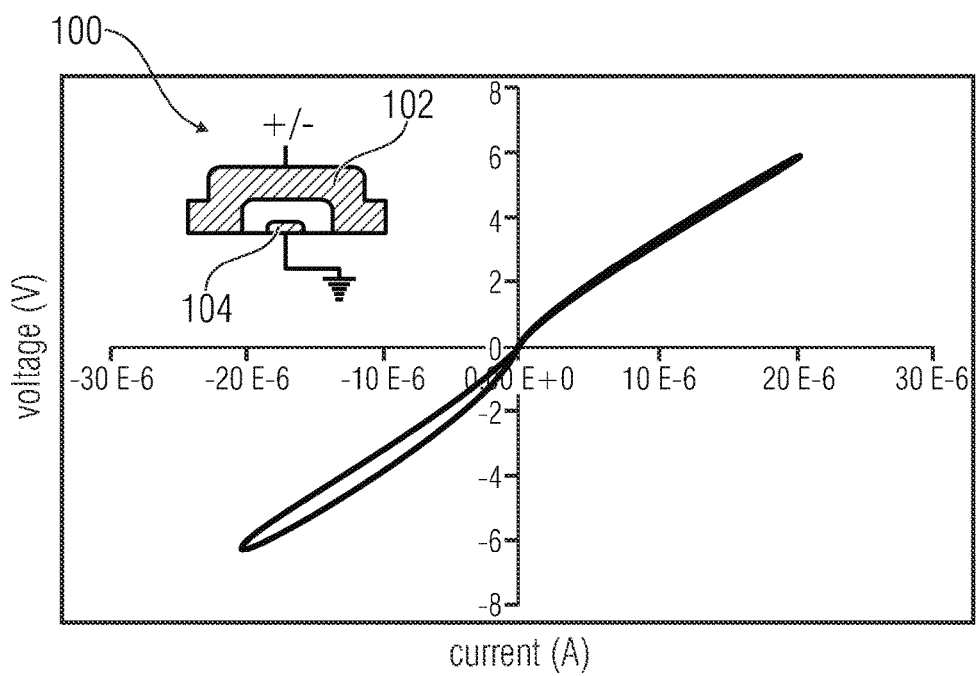
FIG. 4d shows in a diagram a current-voltage characteristic of the memristor shown in FIG. 4b for a positive/negative voltage sweep applied to the second electrode.
Figure 4E:
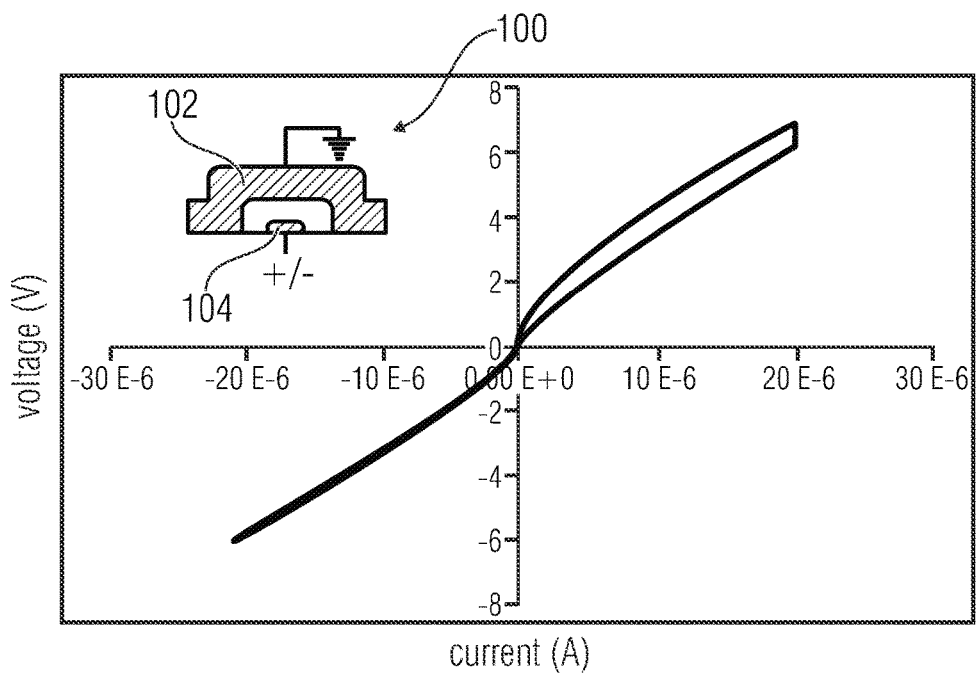
FIG. 4e shows in a diagram a current-voltage characteristic of the memristor shown in FIG. 4b for a positive/negative voltage sweep applied to the first electrode.

In FIG. 4a, the synapse and the direction of the neurotransmitter flow from axon 130 to dendrite 132 are illustrated. Through exocytosis the neurotransmitters are released from the pre-synaptic membrane 136 (interface 1 or boundary surface 1) into the synaptic gap 134. The neurotransmitters diffuse via the gap 134 to the receptors on the post-synaptical membrane 138 (interface 2 or boundary surface 2). In FIG. 4b, the asymmetric memristor 100, the direction of current flow, i(t), and the hysteretic change of the internal resistance are shown, where in FIG. 4c the corresponding scanning electron microscope (SEM) image of the structure is illustrated. The one-side hysteresis is clearly obvious in FIGS. 4d and 4e for a biasing applied to the top micro-scale electrode 102 (FIG. 4d) and for a biasing applied to the bottom nano-scale electrode 104 (FIG. 4e). In both cases there is a current flow in the direction of the top micro-scale electrode 102 (i(t) in FIGS. 4d and 4e), which results in a hysteresis. For both measurements current is changed from zero to 20 µA, held around 20 µA for 250 seconds (bias) and is then changed from 20 µA to −20 µA, held around −20 µA for 250 seconds (bias) and is again set to zero. With any number of repetitions always exactly those asymmetrical current/voltage characteristic curves are acquired.

FIG. 5a shows in a diagram the current-voltage characteristic of the memristor 100 for a positive voltage sweep applied to the first electrode 102 and the current-voltage characteristic of the memristor 100 for a positive voltage sweep applied to the second electrode 104. Thereby, the ordinate denotes the voltage in V, where the abscissa denotes the current in A.

In FIG. 5a, a first curve 150 denotes the current-voltage characteristic of the memristor 100 for a positive current applied to the second electrode 104 (e.g., bottom electrode), where a second curve 152 denotes the current-voltage characteristic of the memristor 100 for a positive current applied to the first electrode 102 (e.g., top electrode).

FIG. 5b shows in a diagram a temporal change of the resistance of the memristor 100 when applying two subsequent positive biases and two subsequent negative biases to the second electrode. Thereby, the ordinate denotes the resistance in kΩ, where the abscissa denotes the time in s.

In FIG. 5b, a first curve 154 denotes the resistance of the memristor 100 for a positive first bias applied to the second electrode 104 (e.g., bottom electrode), wherein the first electrode 102 (e.g., top electrode) is connected to ground. A second curve 156 denotes the resistance of the memristor 100 for a positive second bias applied to the second electrode 104, wherein the first electrode 102 is connected to ground. A third curve 158 denotes the resistance of the memristor 100 for a negative first bias applied to the second electrode 104, where the first electrode 102 is connected to ground. A fourth curve 160 denotes the resistance of the memristor 100 for a negative second bias applied to the second electrode 104, where the first electrode 102 is connected to ground.

FIG. 5c shows in a diagram the current-voltage characteristic of the memristor 100 for a negative voltage sweep applied to the first electrode 102 and the current-voltage characteristic of the memristor for a negative voltage sweep applied to the second electrode 104. Thereby, the ordinate denotes the voltage in V, where the abscissa denotes the current in A.

In FIG. 5c, a first curve 162 denotes the current-voltage characteristic of the memristor 100 for a negative current applied to the second electrode 104 (e.g., bottom electrode), where a second curve 164 denotes the current-voltage characteristic of the memristor 100 for a negative current applied to the first electrode 102 (e.g., top electrode).

FIG. 5d shows in a diagram a temporal change of the resistance of the memristor 100 when applying two subsequent positive biases and two subsequent negative biases to the first electrode 102. Thereby, the ordinate denotes the resistance in kΩ, where the abscissa denotes the time in s.

In FIG. 5d, a first curve 166 denotes the resistance of the memristor 100 for a negative first bias applied to the first electrode 102 (e.g., top electrode), wherein the second electrode 104 (e.g., bottom electrode) is connected to ground. A second curve 168 denotes the resistance of the memristor 100 for a negative second bias applied to the first electrode 102, wherein the second electrode 104 is connected to ground. A third curve 170 denotes the resistance of the memristor 100 for a positive first bias applied to the first electrode 102, where the second electrode 104 is connected to ground. A fourth curve 172 denotes the resistance of the memristor 100 for a positive second bias applied to the first electrode 102, where the second electrode 104 is connected to ground.

In other words, the function becomes clear when considering the course of the internal resistance during the bias. In FIG. 5a the two positive biases are represented (curves 150 and 152), but only the one towards the top micro-scale electrode (curve 150) results in a hysteresis for the current flow and the corresponding resistance is illustrated in FIG. 5b (curve 154 for a first positive bias and curve 156 for a second positive bias). In FIG. 5c the two negative biases are illustrated but only with a current flow towards the top micro-scale electrode (curve 164) a hysteresis results, and the corresponding resistance is illustrated in FIG. 5d (curves 166 and 168). For both cases there are two important notes to be made. First of all, if in the direction of the hysteresis a second following bias ("bias 2" in FIGS. 5b and 5d) is executed onto the first bias ("bias 1" in FIGS. 5b and 5d), the internal resistance starts from the last resistance value. Second, when the polarity during a bias is changed in the direction of the hysteresis, the resistance value quickly decreases.

When a memristor is positioned between an axon of a first neuron 120 and a dendrite of a second neuron 122, an amplification of the internal resistance of the memristor would have to correspond to a synaptic weakening. This means that a signal from the first neuron 120 ought to have a weakened effect onto the second neuron 122 (direction LTD (LTD=Long Term Depression) region). Vice versa, it is shown that a weakening of the internal resistance of the memristor would correspond to a strong potentiating. I.e., a signal from the first neuron 120 ought to have a stronger effect on the second neuron 122 (direction LTP (LTP=Long Term Potentiation) region). In order for a memristor to represent a biohybrid synapse, this change of the internal resistance with respect to the direction LTD or LTP has to fulfill the conditions (triplets) for STDP. This is only fulfilled by the asymmetric memristor 100.

The exemplary system setup is illustrated in more detail in FIGS. 6a to 6d. In FIG. 6a a schematical illustration of the extracellular potential (ECP) is illustrated, measured by the terminal of the memristor 100 as a negative spike in the extracellular space. If the signal is applied to the bottom electrode 104 (post-synapse), the negative ECP will strongly decrease the internal resistance. When the same is applied to the top electrode 102 (pre-synapse), the negative ECP will slowly increase the internal resistance. In other words, negative signals at the bottom electrode 104 strongly reduce the resistance, where negative signals at the top electrode 102 slowly increase the resistance. FIG. 6b represents the system setup for the biohybrid synapse (connected) between a pre-synaptic neuron A (120) and a post-synaptic neuron B (122).

FIG. 6c shows in a diagram a temporal change of the resistance of the memristor 100 when a post-synaptic, pre-synaptic and post-synaptic (post-pre-post triplet) extracellular potentials are applied subsequently to the memristor. Thereby, the ordinate denotes the resistance, where the abscissa denotes the time.

In FIG. 6c, a first resistance line 180 denotes the initial resistance or initial state of the memristor 100. A second resistance line 182 denotes the resistance of the memristor 100 after a first post-synaptic ECP. A third resistance line 184 denotes the resistance of the memristor 100 after a first pre-synaptic ECP. A fourth resistance line 186 denotes the resistance of the memristor 100 after a second post-synaptic ECP.

As shown in FIG. 6c, the memristor fulfills the "post-pre-post" triplet for LTP in STDP. Thus, more voltage reaches neuron B (122), where an influence from neuron A (120) is increased.

FIG. 6d shows in a diagram a temporal change of the resistance of the memristor 100 when a pre-synaptic, post-synaptic and pre-synaptic (pre-post-pre triplet) extracellular potentials are applied subsequently to the memristor 100. Thereby, the ordinate denotes the resistance, where the abscissa denotes the time.

In FIG. 6d, a first resistance line 190 denotes the initial resistance or initial state of the memristor 100. A second resistance line 192 denotes the resistance of the memristor 100 after a first pre-synaptic ECP. A third resistance line 194 denotes the resistance of the memristor 100 after a first post-synaptic ECP. A fourth resistance line 196 denotes the resistance of the memristor 100 after a second pre-synaptic ECP.

As shown in FIG. 6c, the memristor fulfills the "pre-post-pre" triplet for LTD in STDP. Thus, lesser voltage reaches neuron B (122), where an influence from neuron A (120) is reduced.

In other words, the course of the internal resistance is indicated in FIG. 6c to be a decreased value after a "post-pre-post" triplet (strong potentiating) and in FIG. 6d with a negligible change after a "pre-post-pre" triplet.

Of fundamental importance is the asymmetric behavior of the memristor 100 for both polarities, which provide a correct behavior for fulfilling the STDP conditions. The slow increase in resistance for a polarity as compared to the small decrease in resistance for inverse polarity may be examined using finite element method (FEM) computations for symmetrical and asymmetrical structures.

To summarize, using the asymmetric memristor 100, the problem of interconnecting with real biological neuron networks is solved according to the invention as the electric signal behavior of a neuron is directly copied or reproduced. By signal level adaptations the synapses of a biological neuron may be excited in vivo or in vitro but may also set up as an interface between an electric hardware neuron of a computer circuitry and thus a bio hybrid computer. It is thus possible to see how the biohybrid computer changes synaptic connections and thus adapt to exterior sensory stimuli across longer simulation phases and decodes information.

As biohybrid synapses may be implemented by the inventive device, neuronal interfaces may easily be realized in hardware which was discussed in connection with neuro-prosthesis but could not be implemented. Cochlea implants, retinal stimulation and motoric control in the motor cortex are regarded as application interfaces. Also, neuronal networks and/or biohybrid computer systems are a consideration with respect to the present invention.

Industrial application is given by the use in bio medical engineering. Due to a worldwide continuously aging population, the use of new rehabilitation technology and sensual replacement systems becomes more and more necessary.

Figure 7:
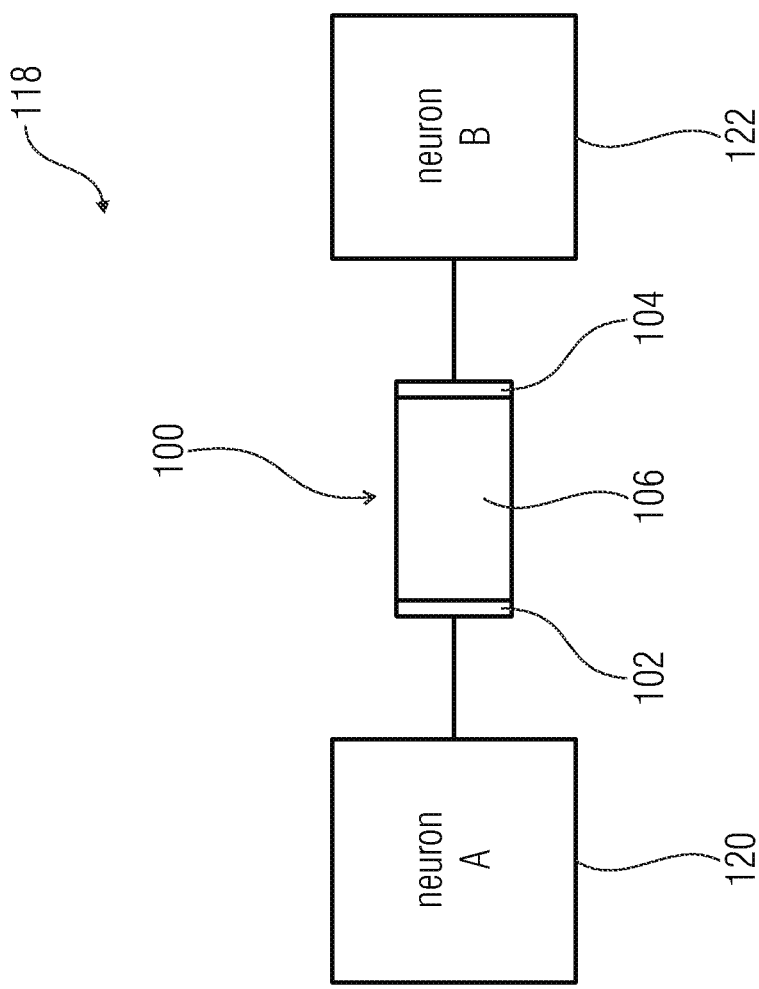
FIG. 7 shows a block diagram of a neural network according to an embodiment of the present invention.

FIG. 7 shows a block diagram of a neural network 118 according to an embodiment of the present invention. The neural network 118 comprise a first neuron 120, a second neuron 122 and the asymmetric memristor 100 according to the concept of the present invention. The asymmetric memristor 100 can be connected in series between the first neuron 120 and the second neuron 122.

As indicated in FIG. 7, the artificial synapse can be realized with an asymmetric memristor 100. This device may directly interconnect with real biological neuronal networks. Due to the asymmetry of the structure there is an unidirectional signal flow within the asymmetric memristor 100. It does not play a role here whether the neurons 120 and 122 establish connections via the asymmetric memristor 100 or via the biological synapse as the function of a real biological synapse is copied/reproduced equivalently.

According to the invention, a further difficulty is eliminated which exists due to different excitation voltages (millivolt) of a neuron and the measured voltages of the extracellular potential (microvolt) when firing a neuron. In this respect, vesicles are emitted from a chemical micro compartment via a voltage controlled permeable membrane into a post-synaptic gap [Daniel T Simon, Sindhulakshmi Kurup, Karin C Larsson, Ryusuke Hori, Klas Tybrandt, Michel Goiny, Edwin W H Jager, Magnus Berggren, Barbara Canlon and Agneta Richter-Dahlfors, Organic electronics for precise delivery of neurotransmitters to modulate mammalian sensory function, 2009, Nature Materials, (8), 9, 742-746. http://dx.doi.org/10.1038/nmat2494], [Norma Graf, Alexander Tanno, Alexander Dochter, Nuria Rothfuchs, Janos Vörös and Tomaso Zambelli, Electrochemically driven delivery to cells from vesicles embedded in polyelectrolyte multilayers, Soft Matter, Doi; 10.1039/c2sm07272f]. Exit probability of the vesicles is proportional to the applied voltage characteristic curve. The secreted neurotransmitters diffuse through the gap and dock to the corresponding tie-points of their specific ion channels and open the ion channels so that ions cross the channels and may thus lead to a depolarization of the neuron. This behavior can be realized by means of an artificial tripartite synapse 300 as will become clear from the discussion of FIG. 8.

Figure 8:
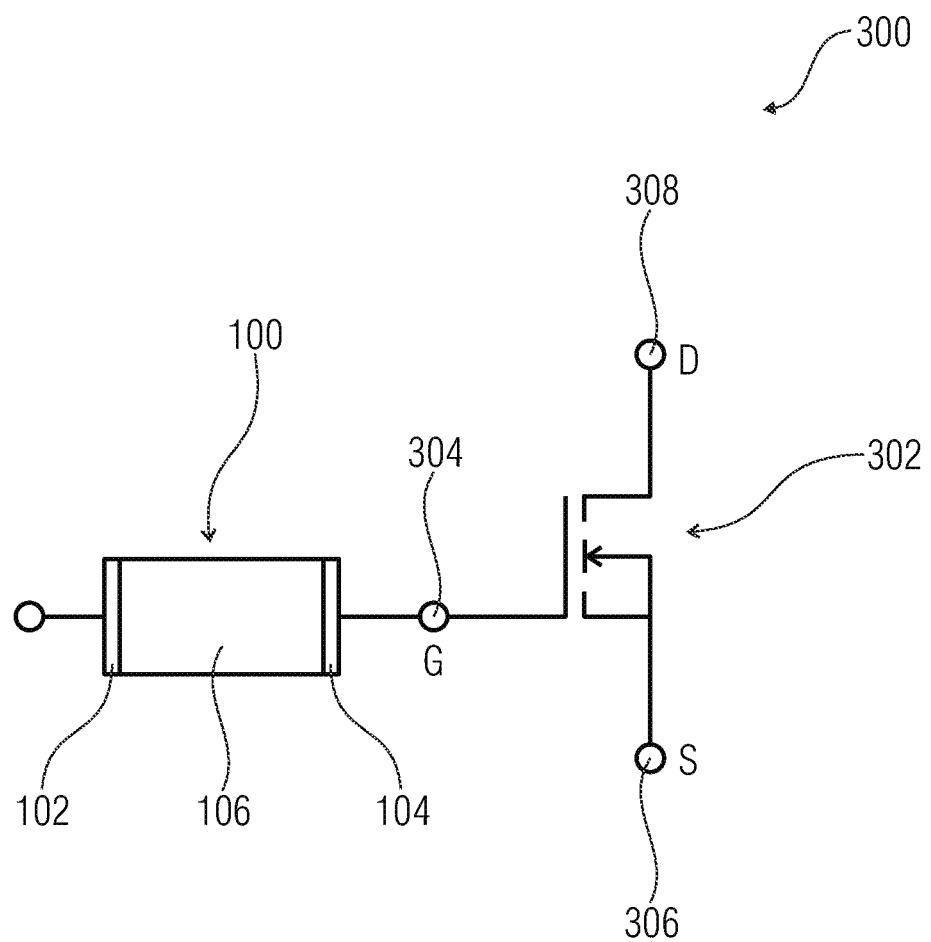
FIG. 8 shows a block diagram of an artificial tripartite synapse according to an embodiment of the present invention.

FIG. 8 shows a block diagram of an artificial tripartite synapse 300 according to an embodiment of the present invention. The artificial tripartite synapse 300 comprises a memristor 100 as already described in detail above and a field effect transistor 302, wherein the memristor 100 is connected to a gate 304 of the field effect transistor 302.

As shown in FIG. 8, the asymmetric memristor 100 can be wired up so that it is applied to the gate 304 of a field effect transistor 302 of the membrane and thus controls source 306 (vesicle in the compartment) and drain 308 (post-synaptic gap). As already mentioned, the circuit is realized at a tripartite synapse 300.

The fact that these synapses are of a biohybrid type remains hidden to the neuronal network. The real biological signal performance of the network remains unchanged. The asymmetric memristor 100 is responsible for strengthening and weakening the connections between neurons 120 and 122 within the network 118. The presence of those biohybrid synapses is hidden from the neuronal network 118 due to the same signal behavior. By this also any coupling with state of the art CMOS technology for amplification, providing an active gain or signal processing is possible and remains hidden for the biological sample.

In some embodiments, the inventive memristor 100 may be implemented in the hybrid three-dimensional sensor array disclosed in the DE 102010000565 A1.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An artificial tripartite synapse, comprising:
    a memristor, comprising a first electrode, a second electrode and a memristive layer arranged between the first electrode and the second electrode, wherein the memristor is adapted such that an asymmetrical current density distribution is obtained in the memristive layer; and
    a field effect transistor;
    wherein the memristor is connected to a gate of the field effect transistor;
    wherein the memristive layer comprises an asymmetrical doping density distribution or an asymmetrical trap density distribution such that the asymmetrical current density distribution is obtained in the memristive layer; and
    wherein the current density varies along an equipotential line within the memristive layer; and
    wherein the first electrode and the second electrode are the same size.

2. The artificial tripartite synapse according to claim 1, wherein the memristor comprises an asymmetry with respect to a material feature of the memristor which is unaffected by a state of the memristor, to obtain the asymmetrical current density distribution in the memristive layer.

3. The artificial tripartite synapse according to claim 1, wherein the memristive layer comprises $TiO_2$.

4. The artificial tripartite synapse according to claim 1, wherein the first electrode and/or the second electrode comprises Ti.

5. A neural network comprising an artificial tripartite synapse according to claim 1.

6. The neural network according to claim 5, further comprising:
    a first neuron;
    a second neuron;
    wherein the artificial tripartite synapse is connected in series between the first neuron and the second neuron.

* * * * *